United States Patent [19]

Stengl et al.

[11] Patent Number: 5,360,759
[45] Date of Patent: Nov. 1, 1994

[54] METHOD FOR MANUFACTURING A COMPONENT WITH POROUS SILICON

[75] Inventors: Reinhard Stengl, Stadtbergen; Wolfgang Hoenlein, Unterhaching; Volker Lehmann, Munich; Andreas Spitzer, Ottobrunn, all of Germany

[73] Assignee: Siemens Aktiengesellschaft, Munich, Germany

[21] Appl. No.: 123,605

[22] Filed: Sep. 17, 1993

[30] Foreign Application Priority Data

Sep. 18, 1992 [DE] Germany .............................. 4231310

[51] Int. Cl.$^5$ ................... H01L 21/283; H01L 21/265
[52] U.S. Cl. ........................................ 437/20; 437/31; 437/905
[58] Field of Search .................... 437/71, 31, 32, 905, 437/20, 170

[56] References Cited

U.S. PATENT DOCUMENTS

| | | |
|---|---|---|
| 3,954,523 | 5/1976 | Magdo et al. |
| 4,092,445 | 5/1978 | Tsuzuki et al. |
| 4,309,812 | 1/1982 | Horng et al. ............... 437/31 |
| 4,322,882 | 4/1982 | Vora ........................... 437/31 |
| 4,532,700 | 8/1985 | Kinney et al. |
| 4,628,591 | 12/1986 | Zorinsky et al. .......... 437/31 |
| 4,701,998 | 10/1987 | Ahlgren et al. ........... 437/31 |
| 4,990,988 | 2/1991 | Lin . |
| 5,023,200 | 6/1991 | Blewer et al. |
| 5,036,021 | 6/1991 | Goto ........................... 437/31 |
| 5,075,241 | 12/1991 | Spratt et al. ............... 437/31 |
| 5,183,777 | 2/1993 | Doki et al. ................. 437/160 |

FOREIGN PATENT DOCUMENTS

| | | | |
|---|---|---|---|
| 152425 | 7/1978 | Japan | 437/71 |
| 58-194352 | 12/1983 | Japan | 437/71 |
| 59-172273 | 9/1984 | Japan . | |

OTHER PUBLICATIONS

Holmstrom et al., Appl. Phys. Lett., v. 42, No. 4 (15 Feb., 1983), pp. 386–388.
Tsao et al, *Multilevel Porous Silicon Formation*, Journal of the Electrochemical Society Bd. 136, No. 2, Feb. 1989, pp. 586–587.
Tsao et al, *Porous Silicon Formation in N—N+N— Doped Structures*, Journal of Electrochemical Society Bd. 138, No. 6, Jun. 1991, pp. 1739–1743.
"Polysilicon Mask for Porous Anodic Etching", IBM Technical Disclosure Bulletin, vol. 18, No. 5, Oct. 1975, p. 1439.
"Current-Induced Light Emission from a Porous Silicon Device", IEEE Electron Device Letters, vol. 12, No. 12, Dec. 1991, pp. 691–692.
"Investigations of the Electrical Properties of Porous Silicon", J. Electrochem. Soc., vol. 138, No. 11, Nov. 1991, pp. 3406–3411.
"Visible Electroluminesence from Porous Silicon NP Heterojunction Diodes", Appl. Phys. Lett. 60 (20), 18 May 1992, pp. 2514–2516.
"Visible Electroluminescence from P-Type Crystalline Silicon/Porous Silicon/N-Type Microcrystalline Silicon Carbon PN Junction Diodes", Jpn. J. Appl. Phys. vol. 31 (1992), pp. L616–L618.
"Nickel Plating on Porous Silicon", J. Electrochem. Soc.: Solid-State Science and Technology, Oct. 1985, pp. 2513–2514.
"Observation of Light-Induced Current from a Porous Silicon Device", Materials Chemistry and Physics, vol. 32 (1992) pp. 310–314.
"Porous Silicon Formation: A Quantum Wire Effect", Appl. Phys. Lett. 58 (8), 25 Feb. 1991, pp. 856–858.
"Silicon Quantum Wire Array Fabrication by Electrochemical and Chemical Dissolution of Wafers", Appl. Phys. Lett. 57 (10), 3 Sep. 1990, pp. 1046–1048.
"Efficient Visible Photoluminescence from Porous Silicon", Jpn. J. Appl. Phys., vol. 30, No. 7B, Jul. 1991, pp. L1221–L1223.

Primary Examiner—George Fourson
Assistant Examiner—S. Mulpuri
Attorney, Agent, or Firm—Hill, Steadman & Simpson

[57] ABSTRACT

For manufacturing a component with porous silicon, two highly doped regions with a lightly doped region arranged between them are formed in a silicon wafer. The dopant concentrations are thereby set such that porous silicon arises in the lightly doped region in a subsequent anodic etching. Light-emitting diodes or light-controlled bipolar transistors can be manufactured in this way.

9 Claims, 2 Drawing Sheets

METHOD FOR MANUFACTURING A COMPONENT WITH POROUS SILICON

BACKGROUND OF THE INVENTION

1. Field of the Invention

The present invention is directed to a method for manufacturing a porous silicon component which guarantees reliable contacting of the porous silicon.

2. Description of the Prior Art

Silicon is an indirect semiconductor having a band gap of 1.1 eV. The manufacture of semiconductor structures for light emission in the visible spectral range using silicon has heretofore not been thought possible by those knowledgeable in the art.

The production of porous silicon is known in the art from V. Lehman et al. *Appl. Phys. Lett.* 58, p. 856 (1991). Porous silicon is formed at the surface of a silicon wafer by anodic etching of single-crystal silicon in a fluoride-containing, acidic electrolyte in which the silicon wafer is connected as anode. Porous silicon comprises pores or canals. The diameter of the canals is dependent on the doping of the silicon wafer. Given a doping of the silicon wafer in the range between $10^{15}$ and $10^{18}$ cm$^{-3}$ yields canals having diameters from 1-2 nm. Canals having diameters of 10 nm–100 nm arise in silicon with a doping of more than $10^{19}$ cm$^{-3}$.

It has been discovered (see v. Lehmann et al., *Appl. Phys. Lett.* 58, p. 856 (1991)) that porous silicon produced from lightly doped silicon with a dopant concentration between $10^{15}$ and $10^{18}$ cm$^{-3}$, and therefore having channels with diameters from 1-2 nm, has a band gap of approximately 1.7 eV and exhibits photoluminescence in the visible spectral range (See L. T. Canham *Appl. Phys. Lett.* 57, p. 1046 (1990) and N. Koshida et al., *Jap. J. Appl. Phys.* 30 p. L1221 (1991)).

An optical semiconductor component with porous silicon using a layer of porous silicon with Schottky contacts by vapor-deposition of gold has been proposed (see the press release of the Fraunhofer Inst. IFT. Sueddeutsche Zeitung, No. 199, p. 37, Aug. 29, 1991). The vapor deposition of metal, however, is difficult because of the porosity of the porous silicon.

SUMMARY OF THE INVENTION

It is an object of the present invention to provide a method for manufacturing a component with porous silicon which guarantees reliable contacting of the porous silicon.

The above object is achieved in accordance with the principles of the present invention in a method wherein two highly doped regions and a lightly doped region disposed therebetween are first formed in a silicon wafer. The dopant concentration is set in a range between $10^{15}$ and $10^{18}$ cm$^{-3}$ in the lightly doped region. The dopant concentration is set to about $10^{19}$ cm$^{-3}$ in the highly doped regions. An anodic etching is then conducted in a fluoride-containing, acidic electrolyte with which the silicon wafer is in contact and in which the silicon wafer is connected as the anode, causing the silicon in the lightly doped region to be converted into porous silicon. As a result of the dopant concentration in the lightly doped region, the porous silicon has canal diameters around 1 to 2 nm. The highly doped regions have canals with diameters in the range from 10 nm through 100 nm due to the dopant concentration prevailing therein. The highly doped regions are firmly joined to the porous silicon of the lightly doped region. The highly doped regions are therefore suitable as terminals for electron injection or hole injection into the porous silicon lying therebetween. Contacts are provided for the highly doped regions.

The anodic etching is preferably conducted using diluted hydrofluoric acid having at least 5 weight percent HF. The current density is set in the range from 1 to 1000 mA/cm$^2$; the voltage of a few volts is dependent on the current density that is set. When the lightly doped region is p-doped, it is advantageous to illuminate the silicon wafer from the backside during the anodic etching.

In a preferred embodiment of the invention, a first layer doped with a first conductivity type having a dopant concentration of at least $10^{19}$ cm$^{-3}$ is produced at the surface of a silicon substrate as a first, highly doped region. A second layer is produced on the first layer by epitaxy; this second layer being doped with a second conductivity type opposite from the first conductivity type and having a dopant concentration in the range between $10^{15}$ and $10^{18}$ cm$^{-3}$. The second layer forms a lightly doped region. The second highly doped region forms a third layer that is doped with the second conductivity type and has a dopant concentration of at least $10^{19}$ cm$^{-3}$. For anodic etching, the surface of the third layer is brought into contact with the electrolyte. Canals having diameters around 10 nm–100 nm thereby occur in the third layer. In the second layer the canals branch into canals having diameters in the range from 1-2 nm. The second layer is converted into porous silicon in this way. For the connection of the first layer, for example, a deeply extending terminal through the third layer and through the second layer having the first conductivity type is doped on the basis of masked implantation. Insulation of a component from the substrate is achieved by doping the silicon substrate with the second conductivity type.

In a further embodiment of the invention, the highly doped regions are driven into a doped silicon layer with a dopant concentration in the range between $10^{15}$ and $10^{18}$ cm$^{-3}$. A first highly doped region is thereby annularly surrounded by a second highly doped region. The part of the doped silicon layer displaced between the first and second highly doped regions thereby forms the lightly doped region. The depth of the first highly doped region is less than the thickness of the doped silicon layer. The depth of the second highly doped region is essentially equal to the thickness of the doped silicon layer. Before the anodic etching, a protective layer that leaves the lightly doped region uncovered is produced at the surface of the highly doped regions. This protective layer prevents an etching attack at the surface of the highly doped regions during the anodic etching. Thus, only the lightly doped region, is converted into porous silicon in this manner. Formation of canals having diameters in the range between 10 nm and 100 nm occurs only at the boundary surfaces between the lightly doped region and the highly doped regions.

Doping the highly doped regions with opposite conductivity types creates a light emitting diode. By contrast, doping the two highly doped regions with the same conductivity type and the lightly doped region with opposite conductivity type, creates components which can be operated as bipolar transistors by applying appropriate contacts.

BRIEF DESCRIPTION OF THE DRAWINGS

The invention shall be set forth in greater detail by way of example with reference to the figures.

DESCRIPTION OF THE PREFERRED EMBODIMENTS

Figure 1:
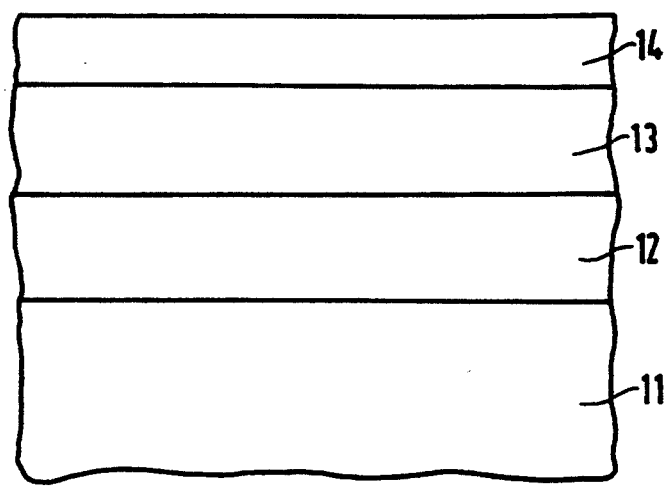
FIG. 1 and FIG. 2 show the manufacture of a component with porous silicon in accordance with the principles of the present invention, in which the highly doped regions and the lightly doped regions are displaced in a vertical manner.
Figure 2:
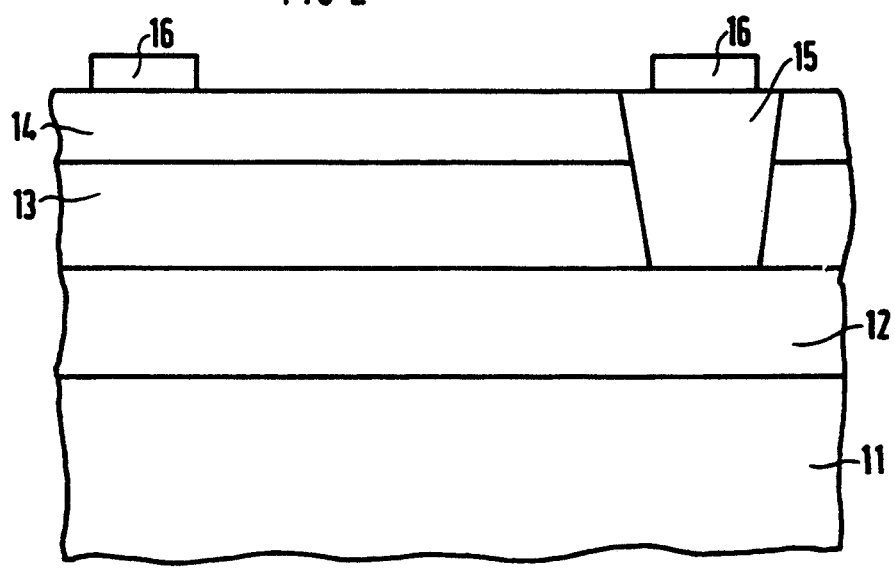

In the inventive method exemplified in the embodiment of FIGS. 1 and 2, a first layer 12 is produced at the surface of the silicon substrate 11. For example, the silicon substrate 11 is p-doped and has a dopant concentration of $10^{15}$–$10^{18}$ cm$^{-3}$. The first layer 12, which forms the first highly doped region, is n+-doped and has a dopant concentration of $10^{19}$–$10^{21}$ cm$^{-3}$. This first layer 12, having a thickness of 400 nm–10 µm, is epitaxially formed by implantation or by diffusion out of a deposited layer.

A second layer 13 is epitaxially applied onto the first layer 12. The second layer 13, having a thickness of 100 nm–2 µm, preferably 600 nm, is p-doped and has a dopant concentration of $10^{15}$–$10^{18}$ cm$^{-3}$.

A third layer 14 is produced at the surface of the second layer 13 epitaxially by implantation or by occupancy. The third layer 14, has a thickness of 100 nm–600 nm, preferably 400 nm, is p+-doped with a dopant concentration of more than $10^{19}$ cm$^{-3}$.

The silicon substrate 11 with the first layer 12, the second layer 13 and the third layer 14 is brought into contact with a fluoride-containing, acidic electrolyte so that the surface of the third layer 14 is completely wetted. The silicon substrate 11 is connected as anode and the electrolyte is connected as cathode. An ensuing anodic etching produces canals with diameters in the range from 10 nm–100 nm resulting in the third layer 14. Due to the lower dopant concentration prevailing in the second layer 13, these canals branch into the second layer 13 to form canals having diameters from 1–2 nm. The anodic etching is implemented until the second layer 13 has been completely converted into porous silicon.

In a preferred embodiment of the invention, a terminal 15 extends through the third layer 14 and the second layer 13 onto the first layer 12 to enable contact with said first layer 12 from the surface of the third layer 13. This terminal 15 along with the respective contact 16 produced at the surface of the third layer 14 is shown in FIG. 2. In a preferred embodiment of the present invention, the contact 16 is produced at the surface of the third layer 14 by vapor deposition of gold, and the terminal 15 is produced by masked implantation, for example.

By applying a positive voltage of approximately 2–10 volts between the contacts 16 shown in FIG. 2, the second layer composed of porous silicon with canals having diameters from 1–2 nm floods with electrons and holes, and light emission occurs as a result.

The silicon substrate 11 and the first layer 12 form a pn-junction that insulates the component from the silicon substrate 11. In applications in which an insulation is of no concern, the silicon substrate 11 can also be n-doped.

Figure 3:
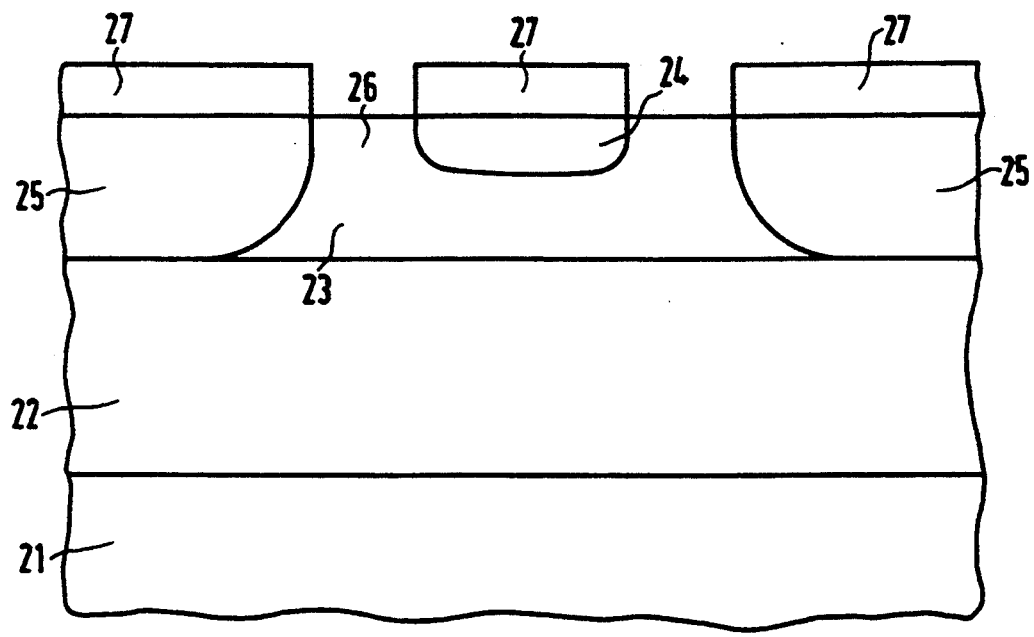
FIG. 3 shows the manufacture of a component in accordance with the principles of the present invention, wherein the highly doped regions and the lightly doped regions are displaced in a lateral manner.

As shown in a preferred embodiment in FIG. 3, a buried layer 22 is produced on a substrate 21 of single crystal silicon which is p-doped and has a dopant concentration of $10^{15}$–$10^{18}$ cm$^{-3}$. The n+-doped buried layer 22 has a dopant concentration of $10^{19}$–$10^{20}$ cm$^{-3}$. This buried layer 22 may be formed epitaxially by implantation or diffusion out of a deposited layer. A p-doped silicon layer 23 having a dopant concentration of $10^{15}$–$10^{18}$ cm$^{-3}$ is disposed from the buried layer 22 by epitaxy. A first highly doped region 24 is disposed in the doped silicon layer 23 for example, by implantation. This first highly doped region 24 is, for example, p-doped and has a dopant concentration of at least $10^{19}$ cm$^{-3}$. A second highly doped region 25 is disposed for example by diffusion, in the doped silicon layer 23. In a preferred embodiment, the second highly doped region 25 annularly surrounds the first highly doped region 24. This second highly doped region 25 is for example n+ doped and has a concentration of at least $10^{19}$ cm$^{-3}$. The part of the doped silicon layer 23 displaced between the first highly doped region 24 and the second highly doped region 25 forms a lightly doped region 26. A structured protective layer 27 composed of photoresist, for example, is disposed at the surface of the highly doped regions 24, 25. This structured protective layer 27 leaves the surface of the lightly doped region 26 uncovered.

Also, the preferred embodiment of the present invention as shown in FIG. 3, the first highly doped region 24 has a shallower depth than the doped silicon layer 23, so that the first highly doped region 24 is separated from the buried layer 22 by the doped silicon layer 23. Also, the second highly doped region 25 has a depth that essentially corresponds to the thickness of the doped silicon layer 23, so that the second highly doped region 25 is in communication with the buried layer 22.

The surface of the lightly doped region 26 and the protective layer 27 is brought into contact with an acidic, fluoride containing electrolyte. The substrate 21 is connected as anode and the electrolyte is connected as cathode. An ensuing anodic etching converts the lightly doped region 26 into porous silicon having canals with diameters in the range from 1–2 nm. Canals having diameters from 10 nm–100 nm can thereby likewise arise as a result at the boundary surface between the lightly doped region 26 and the highly doped regions 24, 25. The anodic etching is preferably conducted in the preferred embodiment with the following parameters:

Fluoride concentration: 10%
Current density: 30 mA/cm$^2$
Etching duration: 20 seconds for example, 600 nm
Illumination from the backside: approximately 100 mW/cm$^2$ (white light).

After the removal of the protective layer 27 (not shown), vapor deposition of aluminum is utilized to produce contacts at the surface of the first highly doped region 24 and at the surface of the second highly doped region 25. The finished component is insulated by n+p-junction at the boundary surface between substrate 21 and the buried layer 22 in the substrate 21.

Figure 4:
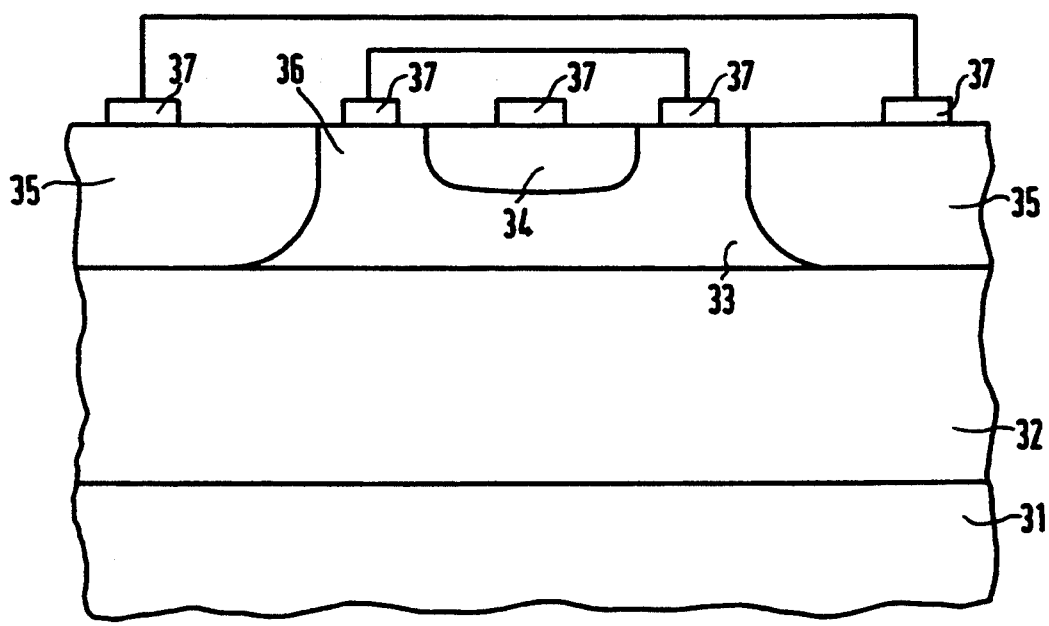
FIG. 4 shows the manufacture of a bipolar transistor in accordance with the principles of the present invention.

In a preferred embodiment of the present invention shown in FIG. 4, a buried layer 32 is disposed on a substrate 31 of single-crystal silicon which is p-doped and has a dopant concentration of $10^{15}$–$10^{18}$ cm$^{-3}$. The n+-doped buried layer 32 having a dopant concentration of least $10^{16}$ cm$^{-3}$ is formed for example by epitaxy implantation or occupancy to a thickness of 400 nm–2 μm. A p-doped silicon layer 33 having a dopant concentration in the range between $10^{15}$–$10^{18}$ cm$^{-3}$ is disposed by epitaxy onto the buried layer 32.

The preferred embodiment of the present invention of FIG. 4 shows a first highly doped region 34 disposed at the surface of the doped silicon layer 33 by diffusion. The n+-doped first highly doped region 34 has a dopant concentration on at least $10^{19}$ cm$^{-3}$ and a depth that is less than the thickness of the doped silicon layer 33, so that the first highly doped region 34 is separated from the buried layer 32 by the doped silicon layer 33.

A second highly doped region 35 is produced in the doped silicon layer 33 by diffusion. The second highly doped region 35 is n+-doped and has a dopant concentration of at least $10^{19}$ cm$^{-3}$ and annularly surrounds the first highly doped region. The depth of the second highly doped region 35 essentially corresponds to the thickness of the doped silicon layer 33 and is therefore in communication with the buried layer 32. That portion of the doped silicon layer 33 that is arranged between the first highly doped region 34 and the second highly doped region 35 forms a lightly doped region 36.

A structured protective layer (not shown) of, for example, photoresist is produced at the surface of the first highly doped region 34 and the second highly doped region 35. The protective layer leaves the surface of the lightly doped region 36 uncovered. The surface of the lightly doped region 36 and of the protective layer are brought into contact with a fluoride-containing, acidic electrolyte, whereby the electrolyte is connected as cathode and the substrate 31 is connected as anode. By anodic etching, canals having diameters in the range from 1–2 nm are produced in the lightly doped region 36. Porous silicon results. The structured protective layer prevents an etching attack at the surface of the first highly doped region 34 and of the second highly doped region 35. The formation of canals having diameters in the range from 10–100 nm can thereby occur at the boundary surfaces of the lightly doped region 36 to the first highly doped region 34 and to the second highly doped region 35.

The anodic etching preferably ensues with the following parameters:
Hydrofluoric acid concentration: 10%
Current density: 30 mA/cm$^2$
Voltage: a few volts dependent on the current density
Etching duration: 20 seconds for, for example, 600 nm
Illumination from the backside: approximately 100 mW/cm$^2$.

After the removal of the protective layer, contacts 37 are applied to the surface of the first highly doped region 34, to the surface of the lightly doped region 36 and to the surface of the second highly doped region 35. The contacts 37 are produced, for example, by vapor-deposition of aluminum.

The finished component shown in FIG. 4 can be operated as a bipolar transistor. The first highly doped region 34 thereby acts as collector; the lightly doped region 36 that was converted into porous silicon in the anodic etching acts as base; and the second highly doped region 35 acts as emitter. The contacts on the lightly doped region 36 as well as the contacts on the second highly doped region 35 are connected to one another. The bipolar transistor can be controlled by the base by beaming light in.

Although various minor modifications may be suggested by Those versed in the art, it should be understood that we wish to embody within the patent granted hereon all changes and modifications as reasonably and properly come within the scope of our contribution to the art.

We claim:

1. A method for manufacturing a component with porous silicon, comprising the steps of:
   (a) generating a first layer having a first conductivity type and a dopant concentration in a range between $10^{19}$ and $10^{21}$ cm$^3$ at a surface of a wafer of single-crystal silicon substrate;
   (b) generating a second layer having a second opposite conductivity type and a dopant concentration in a range between $10^{15}$ and $10^{18}$ cm$^{-3}$ on said first layer by epitaxy;
   (c) generating a third layer having said second conductivity type and a dopant concentration of at least $10^{19}$ cm$^{-3}$ on at least a portion of said second layer;
   (d) conducting an anodic etching in a fluoride-containing, acidic electrolyte, contacting a surface of said third layer with said electrolyte for anodic etching, connecting said silicon wafer as n anode in said electrolyte, and thereby converting silicon in said lightly doped region into porous silicon; and
   (e) providing electrical contacts for said first layer and said third layer.

2. A method according to claim 1, wherein the step of conducting said anodic etching is further defined by conducting said anodic etching in a HF solution having a concentration of 5–50 weight percent HF, a current density of 1–1000 mA/cm$^2$, a voltage of 2–10 volts, and illuminating from a backside of the silicon wafer during said anodic etching.

3. A method according to claim 1, wherein steps (a), (b) and (c) are respectively further defined by
   generating said first layer with a thickness in a range between 400 nm and 10 μm;
   generating said second layer with a thickness in a range between 100 nm and 600 nm; and
   generating said third layer with a thickness in a range between 100 nm and 600 nm.

4. A method according to claim 1, further comprising a step of doping said silicon substrate with said second conductivity type.

5. A method according to claim 1, further comprising a step of forming a terminal contact to said first layer through said third layer and said second layer.

6. A method according to claim 1, further characterized by the following steps:
   (a) forming said third layer by implanting first and second highly doped regions into said doped silicon layer and annularly surrounding said second highly doped region of said second conductivity type with said first highly doped region, regulating the relative thicknesses of said first and second highly doped regions so that a thickness of said first highly doped region is less than a thickness of said doped silicon layer and a thickness of said second highly doped region is approximately equal to said thickness of said doped silicon layer, wherein a part of said doped silicon layer displaced between said first highly doped region and said second highly doped region forming a lightly doped region;

(b) generating a structured protective layer at the surface of said highly doped region such that said lightly doped region remains uncovered;

(c) conducting said anodic etching with said surface of said lightly doped region and said surface of said protective layer contacting said electrolyte such that said protective layer prevents etching attack at said surface of said highly doped regions; and (d) removing said protective layer before applying said contacts.

7. A method according to claim 6, wherein the step of generating said protective layer is further defined by generating a protective layer consisting of photoresist.

8. A method according to claim 6, wherein the step of implanting said first highly doped region is further defined by generating a first highly doped region of said first conductivity type and the step of epitaxially applying said silicon layer is further defined by generating a silicon layer of said second conductivity type.

9. A method according to claim 6, further comprising a step of forming an electrical contact to said lightly doped region in addition to said electrical contacts to said highly doped regions, wherein the step of implanting said first highly doped region is further defined by generating a first highly doped region of said second conductivity type and the step of epitaxially applying said silicon layer is further defined by generating a silicon layer of said first conductivity type.

* * * * *